US011177147B2

(12) United States Patent
Mitsuya

(10) Patent No.: US 11,177,147 B2
(45) Date of Patent: Nov. 16, 2021

(54) SUBSTRATE TREATMENT APPARATUS, CONTROLLER OF SUBSTRATE TREATMENT APPARATUS, METHOD FOR CONTROLLING SUBSTRATE TREATMENT APPARATUS, AND MEMORY MEDIUM STORING PROGRAM

(71) Applicant: EBARA CORPORATION, Tokyo (JP)

(72) Inventor: Takashi Mitsuya, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 175 days.

(21) Appl. No.: 16/245,448

(22) Filed: Jan. 11, 2019

(65) Prior Publication Data

US 2019/0237350 A1 Aug. 1, 2019

(30) Foreign Application Priority Data

Jan. 29, 2018 (JP) .............................. JP2018-012953

(51) Int. Cl.
*H01L 21/67* (2006.01)
*H01L 21/677* (2006.01)

(52) U.S. Cl.
CPC .. *H01L 21/67276* (2013.01); *H01L 21/67034* (2013.01); *H01L 21/67161* (2013.01); *H01L 21/67173* (2013.01); *H01L 21/67742* (2013.01); *H01L 21/67745* (2013.01); *H01L 21/67751* (2013.01)

(58) Field of Classification Search
CPC .............................................. H01L 21/67276
See application file for complete search history.

(56) References Cited

U.S. PATENT DOCUMENTS

| 9,287,145 | B2* | 3/2016 | Nakaharada | ...... H01L 21/67213 |
| 9,984,904 | B2* | 5/2018 | Nakaharada | ...... H01L 21/67706 |
| 2009/0013932 | A1* | 1/2009 | Sakamoto | ............... G03F 7/162 |
| | | | | 118/719 |
| 2009/0097950 | A1* | 4/2009 | Tanaka | ............... H01L 21/67276 |
| | | | | 414/222.13 |
| 2009/0098298 | A1* | 4/2009 | Miyata | .............. H01L 21/67276 |
| | | | | 427/372.2 |

(Continued)

FOREIGN PATENT DOCUMENTS

JP 2011-146448 A 7/2011

*Primary Examiner* — Thomas Randazzo
(74) *Attorney, Agent, or Firm* — Rothwell, Figg, Ernst & Manbeck, P.C.

(57) ABSTRACT

A substrate treatment apparatus includes a plurality of treatment chambers performing different treatment types on a substrate; a transfer device; and a controller that controls the transfer of the substrate and the substrate treatment. The controller enables fixation of a time for pulling up the substrate for each treatment chambers/treatment type and creation of a transfer schedule for transferring the substrate among the plurality of treatment chambers/treatment types and treating the substrate so as to maximize throughput, and enables correction of the transfer schedule to extend, based on a waiting time of the transfer device after storage of the substrate into a treatment chamber of one treatment type and a waiting time of the treatment chamber after treatment of the substrate, a time required for pulling up the substrate from a treatment chamber of an immediately previous treatment type in transfer order of the substrate.

16 Claims, 10 Drawing Sheets

(56) References Cited

U.S. PATENT DOCUMENTS

| | | | |
|---|---|---|---|
| 2011/0172800 A1 | 7/2011 | Koizumi et al. | |
| 2013/0112224 A1* | 5/2013 | Nakaharada | H01L 22/20 |
| | | | 134/18 |
| 2014/0161571 A1* | 6/2014 | Hiraide | H01L 21/67167 |
| | | | 414/217.1 |
| 2015/0027638 A1* | 1/2015 | Kaneko | H01L 21/67276 |
| | | | 156/345.54 |
| 2015/0380287 A1* | 12/2015 | Ocker | C23C 16/46 |
| | | | 427/255.28 |

* cited by examiner

Fig. 3

OPERATION TIME PARAMETER SETTINGS (sec)

| TRANSFER ROBOT | DESTINATION | | | |
|---|---|---|---|---|
| SOURCE | CASSETTE A | CASSETTE B | SPIN RINSING DRYER | ... |
| CASSETTE A | 0 | 1 | 3 | |
| CASSETTE B | 1 | 0 | 2 | |
| SPIN RINSING DRYER | 3 | 2 | 0 | |
| ... | | | | |

| TRANSFER MACHINE 114 | DESTINATION | | | | |
|---|---|---|---|---|---|
| SOURCE | SUBSTRATE MOUNTING/ DISMOUNTING PART | PREWETTING CHAMBER | PRESOAKING CHAMBER | BLOWING CHAMBER | ... |
| SUBSTRATE MOUNTING/ DISMOUNTING PART | 0 | 1 | 2 | 4 | |
| PREWETTING CHAMBER | 1 | 0 | 1 | 3 | |
| PRESOAKING CHAMBER | 2 | 1 | 0 | 2 | |
| BLOWING CHAMBER | 4 | 3 | 2 | 0 | |
| ... | | | | | |

| TRANSFER MACHINE 115 | DESTINATION | | | | |
|---|---|---|---|---|---|
| SOURCE | BLOWING CHAMBER | PLATING CHAMBER A | PLATING CHAMBER B | ... | ... |
| BLOWING CHAMBER | 0 | 2 | 4 | | |
| PLATING CHAMBER A | 2 | 0 | 2 | | |
| PLATING CHAMBER B | 4 | 2 | 0 | | |
| ... | | | | | |
| ... | | | | | |

Fig. 4

CONSTRAINT CONDITION PARAMETER SETTINGS (sec)

| | UPPER LIMIT OF WAITING FOR TAKE-OUT AFTER TREATMENT |
|---|---|
| PREWETTING CHAMBER | 30 |
| PRESOAKING CHAMBER | 30 |
| PLATING CHAMBER A | 5 |
| PLATING CHAMBER B | 5 |

Fig. 5

WHOLE RECIPE SETTINGS

| No. | RECIPE ID | UNIT RECIPE SELECTION | | | | | |
|---|---|---|---|---|---|---|---|
| | | PREWETTING CHAMBER | PRESOAKING CHAMBER | PLATING CHAMBER A | PLATING CHAMBER B | BLOWING CHAMBER | SPIN RINSING DRYER |
| 1 | ABC | STD | - | - | STD | STD | STD |
| 2 | XYZ | TEST | TEST | TEST | - | TEST | TEST |
| ~ | | | | | | | |

Fig. 6

UNIT RECIPE SETTINGS

| PREWETTING CHAMBER | RECIPE ID | TREATMENT TIME |
|---|---|---|
| | STD | 30s |
| | TEST | 5s |

| PRESOAKING CHAMBER | RECIPE ID | TREATMENT TIME |
|---|---|---|
| | STD | 30s |
| | TEST | 5s |

| PLATING CHAMBER A | RECIPE ID | TREATMENT TIME |
|---|---|---|
| | STD | 500s |
| | TEST | 5s |

| PLATING CHAMBER B | RECIPE ID | TREATMENT TIME |
|---|---|---|
| | STD | 500s |
| | TEST | 5s |

| SPIN RINSING DRYER | RECIPE ID | TREATMENT TIME |
|---|---|---|
| | STD | 30s |
| | TEST | 5s |

T10: Pull up, T11: Wait (No Operation), T12: Store, T13: Recipe Treatment
T21: Pull up, T22: Move, T23: Store, T24: Wait (No Operation), T25: Preliminary move, T26: Pull up,
T27: Move, T28: Store, T29: Move, T30: Pull up, T31: Move, T32: Store, T33: Wait (No Operation), T34: Move
T42: Store, T43: Recipe Treatment, T44: Wait (No Operation), T45: Pull up, T46: Wait (No Operation)

SUBSTRATE TREATMENT APPARATUS, CONTROLLER OF SUBSTRATE TREATMENT APPARATUS, METHOD FOR CONTROLLING SUBSTRATE TREATMENT APPARATUS, AND MEMORY MEDIUM STORING PROGRAM

CROSS REFERENCE TO RELATED APPLICATION

This application claims priority to Japanese Application Number 2018-012953, filed Jan. 29, 2018, the entire content of which is hereby incorporated by reference.

TECHNICAL FIELD

The present invention relates to a substrate treatment apparatus, a controller of the substrate treatment apparatus, a method for controlling the substrate treatment apparatus, and a memory medium that stores a program for causing a computer to perform the method for controlling the substrate treatment apparatus.

BACKGROUND ART

There are substrate treatment apparatuses having various configurations. The substrate treatment apparatus has, for example, a plurality of treatment chambers each containing a treatment solution (a medical solution or pure water) and transfers a substrate which is a treatment target or a substrate holding mechanism which holds a substrate by using a transfer mechanism for inter-chamber movement, to perform a plurality of sorts of treatment on the substrate. In each treatment chamber, the treatment target is lowered by the transfer mechanism for inter-chamber movement or another lifting transfer mechanism to be immersed into the treatment solution, and the treatment target after predetermined treatment is pulled up by the transfer mechanism for inter-chamber movement or another lifting transfer mechanism to be transferred to the next treatment chamber by the transfer mechanism for inter-chamber movement. The lowering operation and the lifting operation during the above time are performed at a preset speed.

When the substrate treatment apparatus receives a substrate treatment execution instruction on a newly supplied substrate, scheduling software called a substrate transfer scheduler performs scheduling calculation so as to maximize the number of substrates treated per unit time as the whole apparatus (throughput) based on a plurality of given substrate treatment conditions (plating time, current value, limit on transfer waiting time after treatment, etc.), setting information for a transfer mechanism operation time, and the like (e.g., Japanese Patent Laid-Open No. 2011-146448). Based on time table data created by the above calculation, the data including information such as the sorts of operations and a start time of each operation, each transfer control equipment performs the transfer operation on the substrate or the substrate holding mechanism that holds the substrate.

PRIOR ART LITERATURE

Patent Literature

Patent Literature 1: Japanese Patent Laid-Open No. 2011-146448

SUMMARY OF INVENTION

Technical Problem

Generally, in a system to immerse a substrate into a treatment solution chamber and pulls up the substrate, a treatment solution adheres to the substrate and/or a substrate holder (hereinafter collectively referred to simply as a substrate holder) and is taken out, so that it is necessary to replenish a new treatment solution in amount corresponding to the taken-out amount. With the treatment solution being expensive, it is required to reduce the amount of the treatment solution taken out from the treatment chamber as much as possible.

As a method for reducing the taken-out amount, the treatment solution having adhered to the substrate holder is dropped into the original treatment chamber by decreasing a speed at which the substrate holder is pulled up or by pulling up and thereafter stopping the substrate holder to remain its position for a predetermined time period, so that the amount of treatment solution taken out can be reduced. However, when the pulling-up required time necessary for the whole pulling-up operation (from the start of pulling-up to the start of movement to the next treatment chamber) increases, it causes a decrease in throughput in the whole apparatus. There has thus been conducted an operation in which such a pulling-up speed at which the taken-out amount is in a range not affecting the throughput and in an allowable range is grasped in advance by experiment, simulation, or the like, and the fixed speed grasped as a result is used at the time of actual production. Although the amount of the treatment solution taken out can further be reduced due to the transfer operation having a margin depending on the substrate treatment conditions, the current technique has a problem of being unable to deal with such reduction.

It is an object of the present invention to solve at least a part of the problem described above.

Solution to Problem

According to one aspect of the present invention, there is provided a substrate treatment apparatus including: a plurality of treatment chambers that perform treatment of different treatment types on a substrate; a transfer device that transfers the substrate; and a controller that controls the transfer of the substrate by the transfer device and the substrate treatment in each of the plurality of treatment chambers. The controller is configured to enable fixation of a time required for pulling up the substrate from each of the treatment chambers for each treatment type and creation of a transfer schedule for transferring the substrate among the plurality of treatment chambers of the plurality of treatment types and treating the substrate so as to maximize a throughput, and enable correction of the transfer schedule so as to extend a time required for pulling up the substrate from a treatment chamber of an immediately previous transfer type in transfer order of the substrate based on a waiting time of the transfer device after storage of the substrate into the treatment chamber of one treatment type and a waiting time of the treatment chamber after treatment of the substrate in the treatment chamber of the one treatment type.

BRIEF DESCRIPTION OF DRAWINGS

FIG. 3 shows a setting example of operation time parameters in substrate transfer control;

FIG. 4 shows a setting example of constraint condition parameters in the substrate transfer control;

FIG. 5 shows an example of whole recipe settings;

FIG. 6 shows an example of unit recipe settings;

DESCRIPTION OF EMBODIMENTS

Embodiments of the present invention will be described below with reference to the drawings. In each of the following embodiments, the same or corresponding member is provided with the same numeral and a repeated description will be omitted. Further, in the present specification, expressions such as "above", "below", "left", and "right" will be used, but these are to show positions or directions on illustrative drawings for convenience of description, and may be different from actual arrangement in actual use of an apparatus.

First Embodiment

Figure 1:
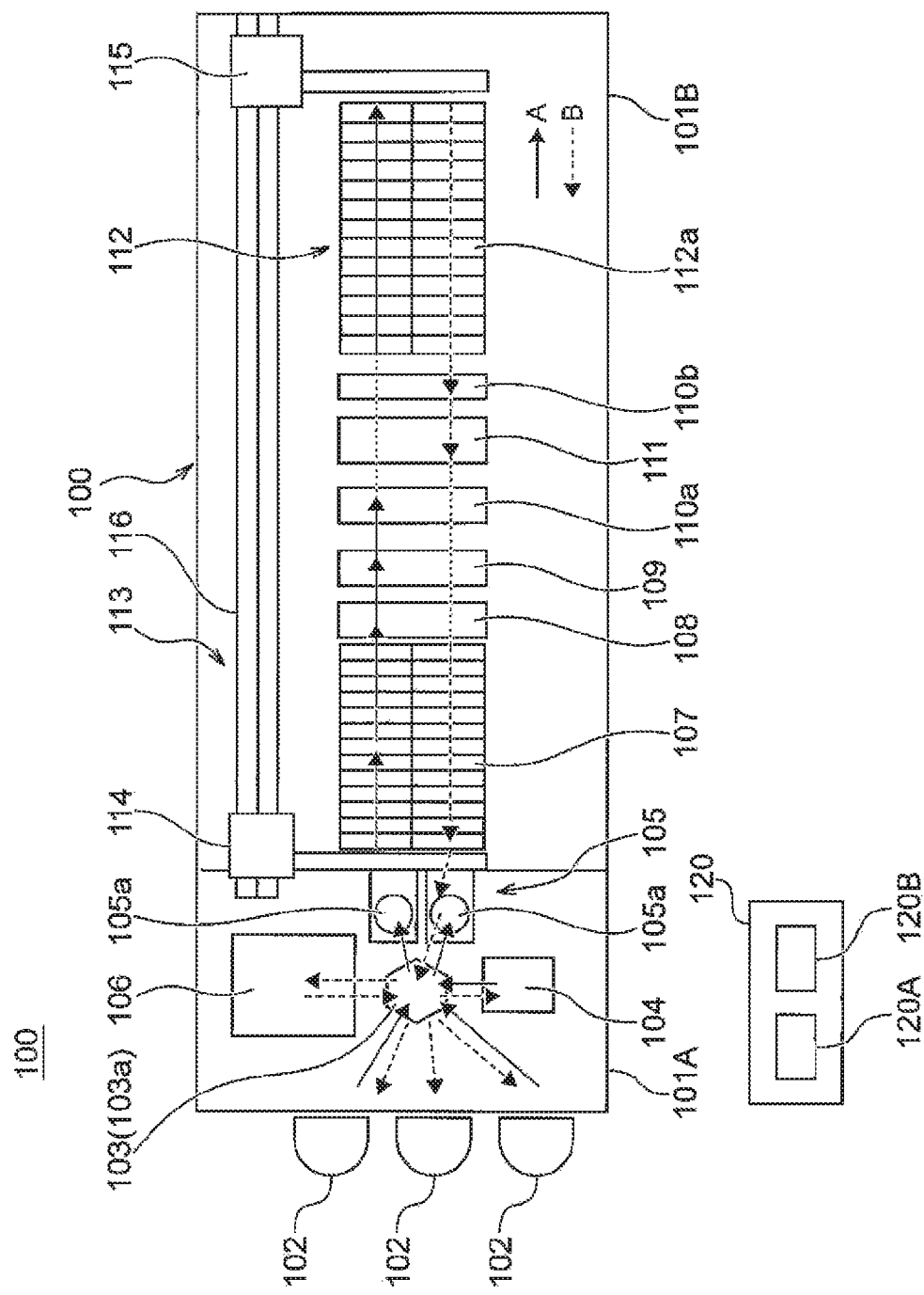
FIG. 1 is a whole arrangement diagram of a substrate treatment apparatus according to one embodiment of the present invention.

FIG. 1 is a whole arrangement diagram of a substrate treatment apparatus according to one embodiment of the present invention. In this example, a substrate treatment apparatus 100 is an electrolytic plating apparatus. Although a description will be given here by taking the electrolytic plating apparatus as an example, a freely selected substrate treatment apparatus including a freely selected plating apparatus can be applied.

A substrate treatment apparatus 100 is briefly divided into a load/unload part 101A that loads a substrate as an object to be treated on a substrate holder (illustration omitted) or unloads the substrate from the substrate holder, and a treatment part 101B that treats the substrate. The substrate includes substrates each having a circular or rectangular shape or the other freely selected shape. The substrate includes a semiconductor wafer, a glass substrate, a liquid crystal substrate, a print substrate, and the other objects to be treated.

The load/unload part 101A has a plurality of cassette tables 102, an aligner 104, a substrate loading/unloading part 105, and a spin rinsing dryer 106. The cassette table 102 is mounted with a cassette storing substrates. The aligner 104 aligns positions of an orientation flat, a notch, and the like of the substrate in predetermined directions. The substrate loading/unloading part 105 is provided with one or a plurality of substrate loading/unloading devices 105a configured to place and remove the substrate on and from the substrate holder. The spin rinsing dryer 106 cleans the substrate after plating treatment and rotates the substrate at high speed for drying. At the center of these units, a substrate transfer device 103 is disposed, including a transfer robot 103a that transfers the substrate among these units.

The treatment part 101B has a stocker 107 in which substrate holders are kept and temporarily put, a prewetting chamber 108, a presoaking chamber 109, a presoaking rinsing chamber 110a, a blowing chamber 111, a rinsing chamber 110b, and a plating treatment part 112. In the prewetting chamber 108, the substrate is immersed into pure water. In the presoaking chamber 109, an oxide film on the surface of a conductive layer such as a seed layer formed on the surface of the substrate is removed by etching. In the presoaking rinsing chamber 110a, the substrate after presoaking is cleaned with a cleaning solution (pure water, etc.) together with the substrate holder. In the blowing chamber 111, the substrate after cleaning is drained. In the rinsing chamber 110b, the substrate after plating is cleaned with the cleaning solution together with the substrate holder. The plating treatment part 112 has a plurality of plating chambers 112a provided with an overflowing chamber. Each plating chamber 112a stores one substrate thereinto and immerses the substrate into a plating solution held on the inside to plate the substrate surface with copper or the like. In this context, the type of the plating solution is not particularly limited, but various solutions are used in accordance with the usage. In the case of performing a plurality of different sorts of plating treatment on one substrate, the plating treatment part 112 has a plurality of plating chambers 112a containing a plurality of types of plating solutions.

The substrate treatment apparatus 100 has a substrate holder transfer device 113 which is located lateral to each of the above equipment, transfers the substrate holder among each of the equipment, and adopts a linear motor system, for example. The substrate holder transfer device 113 has a transfer machine 114 and a transfer machine 115. The transfer machine 114 and the transfer machine 115 travel on a rail 116. The transfer machine 114 transfers the substrate holder among the stocker 107, the substrate loading/unloading part 105, the prewetting chamber 108, the presoaking chamber 109, the presoaking rinsing chamber 110a, and the blowing chamber 111. The transfer machine 115 transfers the substrate holder among the presoaking rinsing chamber 110a, the blowing chamber 111, the rinsing chamber 110b, and the plating treatment part 112. Note that only the transfer machine 114 may be provided without provision of the transfer machine 115, and the transfer machine 114 may perform the transfer among each of the parts described above. Note that this configuration of the substrate treatment apparatus 100 is a mere example, and another configuration can be adopted.

In the substrate treatment apparatus 100, a transfer robot 103a takes out an untreated substrate from a cassette placed on the cassette table 102 and places the substrate on the aligner 104, and the aligner 104 positions the substrate with an orientation flat or a notch taken as a reference. Next, a transfer robot 103a carries the substrate to the substrate loading/unloading device 105a and mounts the substrate on the substrate holder taken out from the stocker 107. In this context, the substrate is mounted on the substrate holder in each of two substrate loading/unloading devices 105a, and the two substrate holders are carried as a pair. The substrate mounted in the substrate holder is carried by the transfer machine 114 to the prewetting chamber 108. After being subjected to prerinsing treatment, the substrate is carried to the presoaking chamber 109 to be subjected to pretreatment, and is further transferred to the presoaking rinsing chamber 110a to be subjected to rinsing treatment.

The substrate subjected to the rinsing treatment in the presoaking rinsing chamber 110a is carried by the transfer machine 115 to any of the plating chambers 112a in the plating treatment part 112 to be immersed into the plating solution. The plating treatment is performed here to form a metal film on the substrate. In the case of performing a plurality of sorts of plating treatment, the substrate is sequentially transferred to the plurality of plating chambers 112a to be subjected to plating treatment. The substrate after plating treatment is carried by the transfer machine 115 to the rinsing chamber 110b, and after being subjected to rinsing treatment, the substrate is carried to the blowing chamber 111 to be subjected to rough drying treatment. Thereafter, the substrate is carried by the transfer machine 114 to the substrate loading/unloading device 105a, and here the substrate is removed from the substrate holder. The substrate removed from the substrate holder is carried by the transfer robot 103a to the spin rinsing dryer 106, and after being subjected to cleaning and drying treatment, the substrate is stored into the cassette on the cassette table 102.

(Control Configuration)

Figure 2:
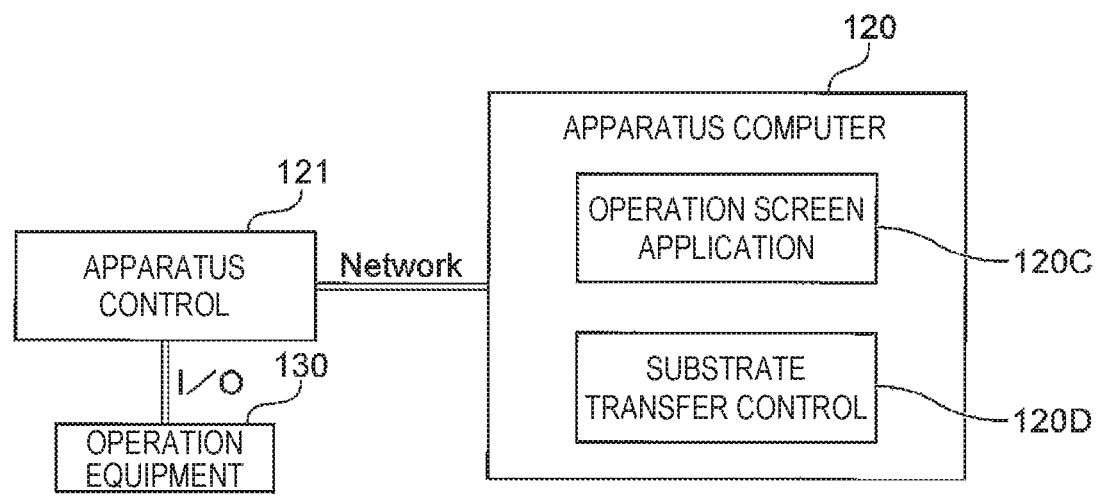
FIG. 2 is an explanatory diagram for explaining a control configuration of the substrate treatment apparatus.

FIG. 2 is an explanatory diagram for explaining a control configuration of the substrate treatment apparatus. The substrate treatment apparatus 100 is mainly provided with an apparatus computer 120 and an apparatus controller 121. The apparatus computer 120 is connected to the apparatus controller 121 via a wired or wireless network, cable, or the like. Various pieces of operation equipment 130 of the substrate treatment apparatus 100 is connected to the apparatus controller 121 via a predetermined interface I/O. The apparatus computer 120 and the apparatus controller 121 cooperate to control various pieces of operation equipment 130 of the substrate treatment apparatus 100. A control signal from the apparatus computer 120 is transmitted to the apparatus controller 121 via the network, so that various pieces of operation equipment 130 are controlled via the apparatus controller 121. Further, the apparatus computer 120 is configured to be communicable to an upper-rank controller (host computer), not shown, which integrally controls the substrate treatment apparatus 100 and the other related apparatuses by a wired or wireless way, and can exchange data with a database in the upper-rank controller.

The apparatus controller 121 is, for example, made up of a sequencer and the like, and controls various pieces of operation equipment 130 of the substrate treatment apparatus 100 based on a control command from the apparatus computer 120, a setting parameter, a transfer time table, and the like. Various pieces of operation equipment 130 of the substrate treatment apparatus 100 includes the transfer robot 103a, the transfer machines 114, 115 of the substrate holder transfer device 113, and the other equipment.

The apparatus computer 120 has a memory 120B that stores various pieces of setting data and various programs, and a CPU 120A that executes the program of the memory 120B. Although illustration is omitted, the apparatus computer 120 may be provided with an input/output interface that includes an output device such as a display and input devices including a keyboard, a mouse, and the like. A memory medium constituting the memory 120B can include a freely selected volatile memory medium and/or a freely selected non-volatile memory medium. The memory medium can include one or a plurality of freely selected memory mediums such as a ROM, a RAM, a hard disk, a CD-ROM, a DVD-ROM, and a flexible disk.

The program stored in the memory 120B includes an operation screen application 120C (FIG. 2) and scheduling software (transfer scheduler) constituting a substrate transfer control part 120D. The transfer scheduler is scheduling software for calculating a substrate transfer schedule, and substrate transfer control part 120D is configured by execution of the transfer scheduler in the CPU 120A. Further, the programs stored in the memory 120B include, for example, a program for performing transfer control on the substrate transfer device 103, a program for performing placement and removal control on the substrate holder of the substrate in the substrate loading/unloading part 105, a program for performing transfer control on the substrate holder transfer device 113, and a program for performing control on plating treatment in the plating treatment part 112. The operation screen application 120C displays a time table of a substrate transfer schedule, described later, on a display. With the operation screen application 120C, an input from an operator can be accepted. The substrate transfer control part 120D (transfer scheduler) has a function (standard scheduling function) to create the time table of the transfer schedule for performing transfer control so as to maximize a throughput from an operation time of each transfer device and the like, treatment conditions (treatment recipe) for a target substrate, treatment of which has been instructed, the number of substrates to be treated, and the like, which are given in advance. The substrate transfer control part 120D (transfer scheduler) also has a function (pulling-up correction program or routine) to make a correction so as to extend or maximize the time for pulling up the substrate from the target treatment chamber in a range where the throughput does not fall below the throughput calculated from the given treatment conditions. The substrate transfer control part 120D (transfer scheduler) is provided with a schedule creation part that creates the time table of the transfer schedule, and a correction part that makes a correction to extend the time required for pulling up the substrate. The schedule creation part and the correction part are a schedule creation circuit and a correction circuit which are configured by execution of the transfer scheduler in the CPU 120.

FIG. 3 shows a setting example of operation time parameters in the substrate transfer control. This figure shows an example of set values for the time required for transfer of the substrate by each of the transfer robot 103a and the transfer machines 114, 115. In the present embodiment, each of the transfer machines 114, 115 transfers the substrate holder holding the substrate, but this may be expressed simply by that each of the transfer machines 114, 115 transfers the substrate. In the transfer of the substrate by the transfer robot 103a, for example, movement times from a cassette A to a cassette B and to the spin rinsing dryer 106 are 1 sec and 3 sec, respectively. In the transfer of the substrate holder by the transfer machine 114, for example, movement times from the substrate loading/unloading part 105 to the prewetting chamber 108, to the presoaking chamber 109, and to the blowing chamber 111 are 1 sec, 2 sec, and 4 sec, respectively. In the transfer of the substrate holder by the transfer machine 115, for example, movement times from the blowing chamber 111 to a plating chamber A and to a plating chamber B are 2 sec and 4 sec, respectively. Each of the plating chamber A and the plating chamber B is any of the plurality of plating chambers 112a. Although FIG. 3 shows a setting example of a part of operation parameters so as to facilitate understanding, the other operation parameters are also set appropriately.

FIG. 4 shows a setting example of constraint condition parameters in the substrate transfer control. This figure shows, as the setting example of the constraint condition parameters, upper limit values of take-out waiting times after treatment in the prewetting chamber 108, the presoaking chamber 109, the plating chamber A, and the plating chamber B. The upper limit value of the take-out waiting time after treatment is an upper limit value of the waiting time during which the substrate can wait in the treatment solution in the treatment chamber after completion of the recipe-set treatment in each treatment chamber. The upper limit values of take-out waiting times after treatment in the prewetting chamber 108, the presoaking chamber 109, the plating chamber A, and the plating chamber B are 30 sec, 30 sec, 5 sec, and 5 sec, respectively.

FIG. 5 shows an example of whole recipe settings. This figure shows an example of selection of unit recipes with respect to two recipe IDs. In a recipe ID ABC, it is set to execute standard treatment (STD) in the prewetting chamber 108, the plating chamber B, the blowing chamber 111, and the spin rinsing dryer 106. In a recipe ID XYZ, it is set to execute test treatment (TEST) in the prewetting chamber 108, the presoaking chamber 109, the plating chamber A, the blowing chamber 111, and the spin rinsing dryer 106.

FIG. 6 shows an example of unit recipe settings. This figure shows an example of the recipe settings of standard treatment (STD) and test treatment (TEST) in each unit of the prewetting chamber 108, the presoaking chamber 109, the plating chamber A, the plating chamber B, and the spin rinsing dryer 106. For example, the treatment times for the standard treatment and the test treatment in the prewetting chamber 108 are 30 sec and 5 sec, respectively.

Figure 7:
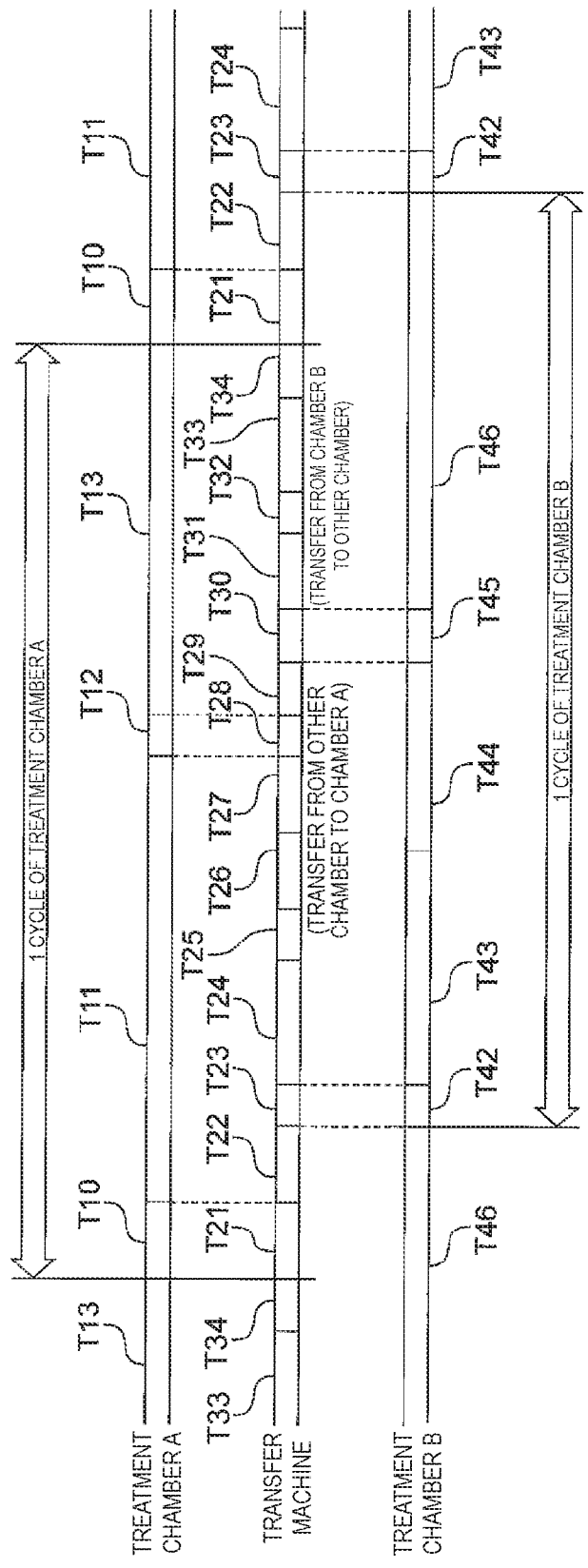
FIG. 7 shows an example of a time table of a substrate transfer schedule.

FIG. 7 shows an example of the time table of the substrate transfer schedule.

This figure shows an example of the transfer schedule in a section in which the substrate is treated in a treatment chamber B after being treated in a treatment chamber A. The treatment chamber A and the treatment chamber B are treatment chambers of successive treatment types in a recipe setting for a specific substrate. Each of the treatment chamber A and the treatment chamber B is, for example, any of the prewetting chamber 108, the presoaking chamber 109, the presoaking rinsing chamber 110*a*, the blowing chamber 111, the rinsing chamber 110*b*, and the plating chamber 112*a*. In the case of performing a plurality of sorts of plating treatment on the substrate, the plating chambers 112*a* of different treatment types (different types of plating solutions) are disposed. Note that the different sorts of plating treatment are handled as different treatment types. In the example of FIG. 1, two substrate holders are transferred as a pair, and one or a plurality of treatment chambers of the same treatment type are disposed along a transfer pathway of each substrate holder. One each of the prewetting chamber 108, the presoaking chamber 109, the presoaking rinsing chamber 110*a*, the blowing chamber 111, and the rinsing chamber 110*b* are disposed. As for the plating treatment that takes a long time, a plurality of plating chambers 112*a* each containing the same plating solution are disposed. In the case of performing a plurality of sorts of plating treatment, two or more each of plating chambers 112*a* containing each type of plating solution are disposed. The recipe setting may change in accordance with the substrate, and the treatment chambers corresponding to the treatment chamber A and the treatment chamber B of the successive treatment types may also change. In the following description, T10, T11, and the like in the figure may each represent a temporal length of a period as well as representing the period. The transfer machine is either the transfer machine 114 or 115. In this example, the substrate is assumed to be transferred by either the transfer machine 114 or 115 in the state of being held on the substrate holder.

In the treatment chamber A, the substrate is stored into the treatment solution in the treatment chamber A in a storage period T12, and recipe-set treatment is performed on the substrate in a recipe treatment period T13. In a pulling-up period T10 (T21), the substrate after treatment is picked up by the transfer machine or another lifting mechanism, and then in a waiting period T11, the treatment chamber A is not operated but waits. These periods constitute one cycle of the treatment chamber A. FIG. 7 represents a period starting from the pulling-up period T10 and ending in the recipe treatment period T13 as one cycle of the treatment chamber A for the sake of convenience.

In the treatment chamber B, the substrate is stored into the treatment solution in the treatment chamber B in a storage period T42, and recipe-set treatment is performed on the substrate in a recipe treatment period T43. Thereafter, in a waiting period T44, the treatment chamber B is not operated but waits. In a pulling-up period T45, the substrate after treatment is picked up by the transfer machine or another lifting mechanism. Thereafter, in a waiting period T46, the treatment chamber B is not operated but waits. These periods constitute one cycle of the treatment chamber B.

In the time table for the transfer machine, in a pulling-up period T21, the substrate after treatment is pulled up by the transfer machine or another lifting mechanism in the treatment chamber A. In a movement period T22, the substrate holder is moved from the treatment chamber A to the treatment chamber B, and in a storage period T23, the substrate holder is stored into the treatment solution in the treatment chamber B. Thereafter, in a waiting period T24, the transfer machine is not operated but waits.

Then, in a preliminary movement period T25, the transfer machine is moved to the other treatment chamber immediately before the treatment chamber A, and in a pulling-up period T26, a subsequent substrate is pulled up by the transfer machine or another lifting mechanism in the immediately previous other treatment chamber. In a movement period T27, the transfer machine moves the subsequent substrate from the immediately previous other treatment chamber to the treatment chamber A, and in a storage period T28, the transfer machine stores the subsequent substrate in the treatment solution in the treatment chamber A.

Subsequently, in a movement period T29, the transfer machine is moved from the treatment chamber A to the treatment chamber B, and in a pulling-up period T30, the substrate after treatment is pulled up by the transfer machine or another lifting mechanism in the treatment chamber B. Then, in a movement period T31, the substrate pulled up from the treatment chamber B is moved to the next treatment chamber, and in a storage period T32, the substrate holder is stored into a treatment solution in the next treatment chamber. Thereafter, in a waiting period T33, the transfer machine is not operated but waits. In a movement period T34, the transfer machine moves from the next treatment chamber to the treatment chamber A and repeats the treatment after the pulling-up period T21 described above. These periods constitute one cycle of the transfer machine.

Figure 8:
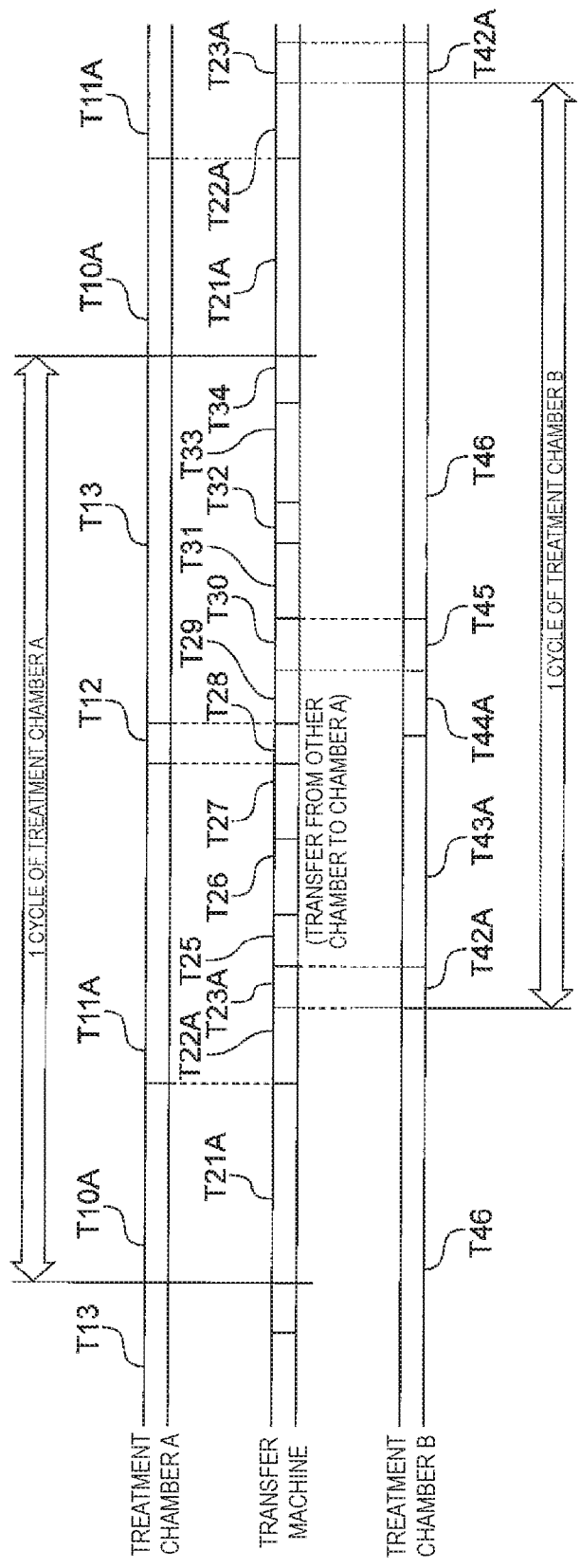
FIG. 8 shows an example of a time table after a correction process on a substrate transfer schedule.

FIG. 8 shows an example of the time table after the correction process on the substrate transfer schedule. In the substrate transfer schedule of FIG. 7 described above, in the transfer machine, the waiting period T24 is after storage of the substrate into the treatment chamber B in the storage period T23. In the treatment chamber B, the waiting period T44 is after the recipe treatment period T43. Therefore, the shorter time between the waiting period T24 after the storage period T23 in the transfer machine and the waiting period T44 after the recipe treatment period T43 in the treatment chamber B is added to the pulling-up period T10 (T21) for pulling up the substrate from the immediately previous treatment chamber A to make a correction so as to extend the pulling-up period to a pulling-up period T10A (T21A) (FIG. 8). The extension to the pulling-up period T10A (T21A) is intended to reduce a pulling-up speed at which the substrate is pulled up from the treatment chamber A and/or to extend the waiting time during which the substrates waits after pulling-up, thereby to drop and return the treatment solution in the treatment chamber A, which has adhered to the substrate and the substrate holder, into the treatment chamber A, so as to reduce the amount of the treatment solution taken out. The pulling-up periods T10 (T21), T10A (T21A) are each defined as the time including the time required for the operation of pulling up the substrate from the treatment chamber A and the waiting time for causing the substrate to wait in the treatment chamber A after pulling-up, and there are cases where the waiting time is 0.

When the shorter time between the waiting period T24 after the storage period T23 in the transfer machine and the waiting period T44 after the recipe treatment period T43 in the treatment chamber B is the waiting period T24, the waiting period T24 is added to the pulling-up period T10 (T21) for pulling up the substrate from the immediately previous treatment chamber A, to make a correction so as to extend the pulling-up period to the pulling-up period T10A (T21A) (FIG. 8). Extending the pulling-up period T10 (T21) to the pulling-up period T10A (T21A) leads to a delay of the storage periods T23, T42 (FIG. 7) for storing the substrate into the treatment chamber B to storage periods T23A, T42A by the time corresponding to the waiting period T24, and also leads to a delay of the subsequent recipe treatment period T43 in the treatment chamber B to a recipe treatment period T43A. Meanwhile, in the treatment chamber B, due to the waiting period T44 (FIG. 7) being after the recipe treatment period T43, the waiting period T44 (FIG. 7) is reduced to a waiting period T44A (FIG. 8) by the time (waiting period T24) corresponding to the delay of the recipe treatment period T43 to the recipe treatment period T43A. That is, the time corresponding to the extension of the pulling-up period T10 (T21) to the pulling-up period T10A (T21A) is absorbed by reduction of the waiting period T44 of the treatment chamber B to the waiting period T44A, and the pulling-up period T45 of the substrate after the recipe treatment period T43A in the treatment chamber B is prevented from being delayed. Further, in the transfer machine, extending the pulling-up period T10 (T21) to the pulling-up period T10A (T21A) leads to delays of the movement period T22 and the storage period T23 (FIG. 7) to the movement period T22A and the storage period T23A (FIG. 8) by the time corresponding to the waiting period T24, but by deleting the waiting period T24 (FIG. 7), the preparation transfer period T25 is prevented from being delayed. This enables reduction or prevention of a decrease in throughput caused by extension of the pulling-up period T10 (T21).

When the shorter time between the waiting period T24 after the storage period T23 in the transfer machine and the waiting period T44 after the recipe treatment period T43 in the treatment chamber B is the waiting period T44, the waiting period T44 is added to the pulling-up period T10 (T21) for pulling up the substrate from the immediately previous treatment chamber A to make a correction so as to extend the pulling-up period to the pulling-up period T10A (T21A) (FIG. 8). In this case, the time corresponding to the delays of the storage period T42A and the recipe treatment period T43A in the treatment chamber B (the time corresponding to the waiting period T44) is absorbed by deletion of the waiting period T44. Further, the time corresponding to the delays of the movement period T22 in the transfer machine and the storage period T23 (the time corresponding to the waiting period T44) is absorbed by reduction in the waiting period T24 by the time corresponding to the waiting period T44. This enables reduction or prevention of a decrease in throughput caused by extension of the pulling-up period T10 (T21).

In addition to adding the whole of the shorter period between the waiting period T24 and the waiting period T44 to the pulling-up period T10 (T21), a part of the shorter period between the waiting period T24 and the waiting period T44 may be added to the pulling-up period T10 (T21). Since the pulling-up period T10 (T21) can also be extended in this case, it is possible to reduce the amount of the treatment solution taken out in accordance with the extension while reducing or preventing a decrease in throughput. In this manner, a part of the waiting period can be left as a margin.

As described above, by the process to allocate a part or all of the waiting time to the pulling-up time, it is possible to extend and correct the pulling-up time in the treatment chamber A without changing the time of one cycle in each of the treatment chambers A, B.

Figure 9:
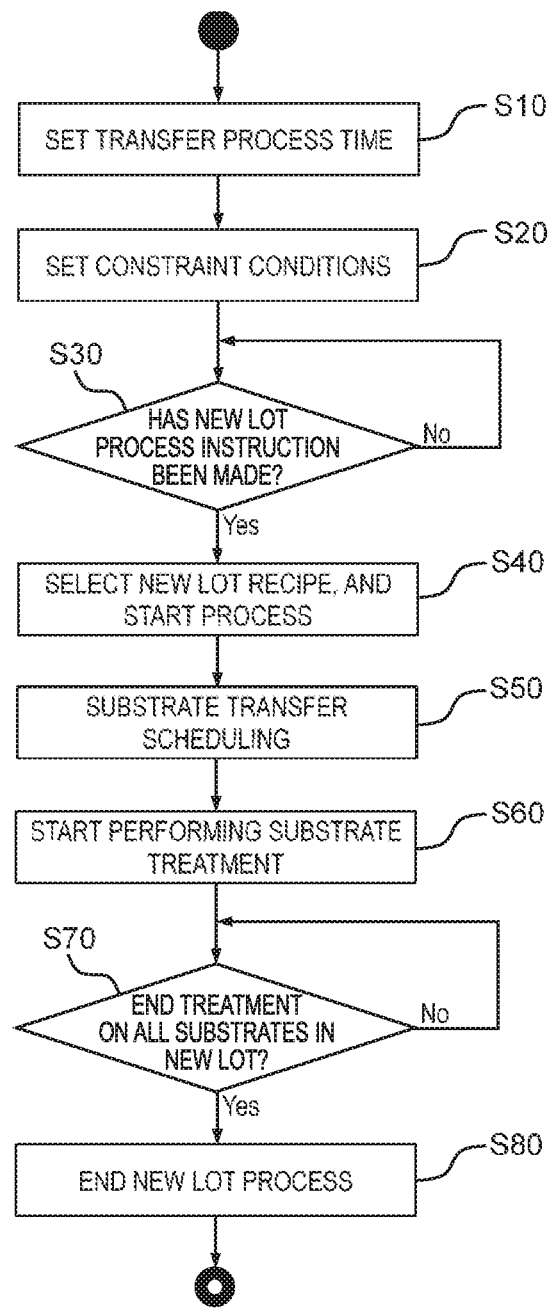
FIG. 9 is a flowchart of substrate treatment.

FIG. 9 is a flowchart of the substrate treatment. Note that each treatment is appropriately shared and performed by the apparatus computer 120 and the apparatus controller 121, and the following description is one example thereof.

In steps S10 and S20, based on contents displayed on a GUI screen displayed on the display of the apparatus computer 120, the operator sets an operation time parameter (FIG. 3) as a transfer process time, and sets a constraint condition parameter (FIG. 4) as a constraint condition. These are also referred to as advance settings.

In step S30, the apparatus computer 120 determines whether or not a new lot process instruction will be made. Until it is determined that the new lot process instruction will be made, the process of step S30 is repeated, and when it is determined that the new lot process instruction will be made, the process shifts to step S40.

In step S40, by a setting from the operator based on the contents displayed on the GUI screen displayed on the display of the apparatus computer 120 or by an automatic command from the upper-rank computer (host computer), a new lot recipe is selected and the process is started.

In step S50, the apparatus computer 120 performs substrate transfer scheduling for calculating a substrate transfer schedule and creating a transfer time table.

In step S60, the apparatus computer 120 and the apparatus controller 121 start performing the substrate treatment. Specifically, the apparatus computer 120 transmits the substrate transfer schedule calculated in step S50 to the apparatus controller 121, and the apparatus controller 121 starts treatment on a plurality of substrates in the new lot based on the substrate transfer schedule. In this substrate treatment, the plurality of substrates in the new lot are transferred one by one or transferred as a group to each unit in the substrate treatment apparatus 100, and the treatment is performed on the substrate.

In step S70, the apparatus computer 120 and/or the apparatus controller 121 determine whether or not the treatment on all the substrates in the new lot has been ended. When the treatment on all the substrates in the new lot has not been ended, the substrate treatment on the new lot is continued. When it is determined that the treatment on all the substrates in the new lot has been ended, the substrate treatment on the new lot is completed (step S80).

Figure 10:
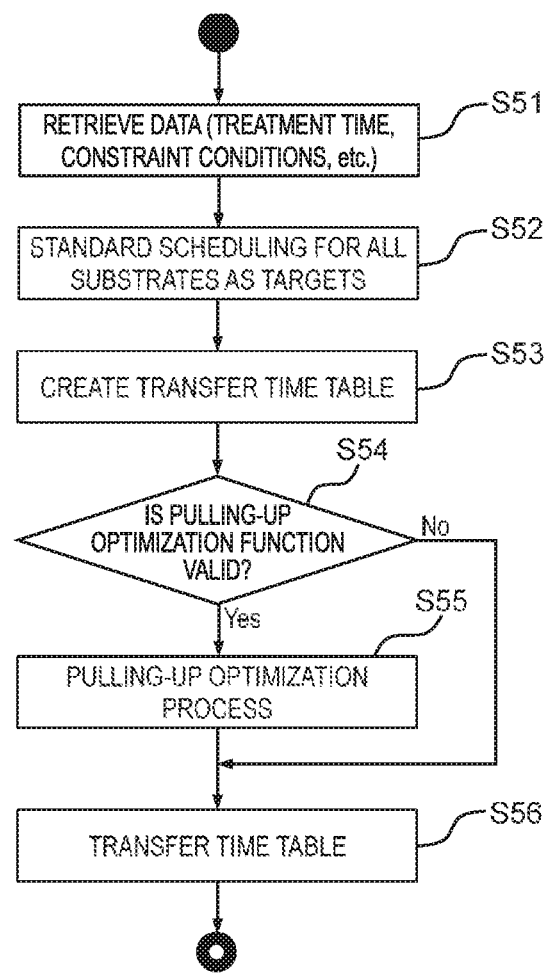
FIG. 10 is a flowchart of substrate transfer scheduling.

FIG. 10 is a flowchart of the substrate transfer scheduling (step S50).

In step S51, pieces of data such as the process time and constraint conditions are retrieved into the transfer scheduler of the apparatus computer 120.

In step S52, the transfer scheduler performs standard transfer scheduling for all the substrates as targets. In this standard transfer scheduling, there is created a standard transfer schedule for performing transfer control so as to maximize the throughput from an operation time of each transfer device and the like, treatment conditions (process recipe) for the target substrate, treatment of which has been instructed, the number of substrates to be treated, and the like, which are given in advance. In this context, the time required for pulling up the substrate from each treatment chamber is fixed for each treatment type, and the standard transfer schedule is created so as to maximize the throughput.

In step S53, the transfer scheduler creates the standard transfer time table (FIG. 7) based on the calculation result of the standard transfer scheduling.

In step S54, the transfer scheduler determines whether or not the transfer machine's pulling-up operation correction function is valid. The transfer scheduler of the present embodiment has a function to notify the operator or the upper-rank side of a recommended value or a recommended setting concerning a change in the pulling-up speed, calculated from the given conditions, when changing the operation requires confirmation or approval of the operator or the upper-rank host computer. The transfer scheduler also has a function to change the operation only when the change in operation is permitted by the operator or the upper-rank host computer. The change in operation is permitted by enabling the transfer machine's pulling-up correction function. Further, the transfer scheduler may be provided with a function to be able to set whether or not the confirmation or approval of the operator or the upper-rank host computer is necessary for changing the operation.

In step S54, when it is determined that the pulling-up correction function (pulling-up optimization function) is valid, the process shifts to step S55, and the transfer machine's pulling-up correction process (pulling-up optimization process) is performed. Thereafter, in step S56, the apparatus computer 120 transmits to the apparatus controller 121 the transfer time table based on the transfer schedule after the operation correction process (the transfer schedule after correction).

On the other hand, when the pulling-up correction function is determined as invalid in step S54, the process shifts to step S56 without the pulling-up correction process of step S55 being performed. In this case, in step S56, the apparatus computer 120 transmits to the apparatus controller 121 the transfer time table based on the standard transfer schedule created in step S53.

Figure 11:
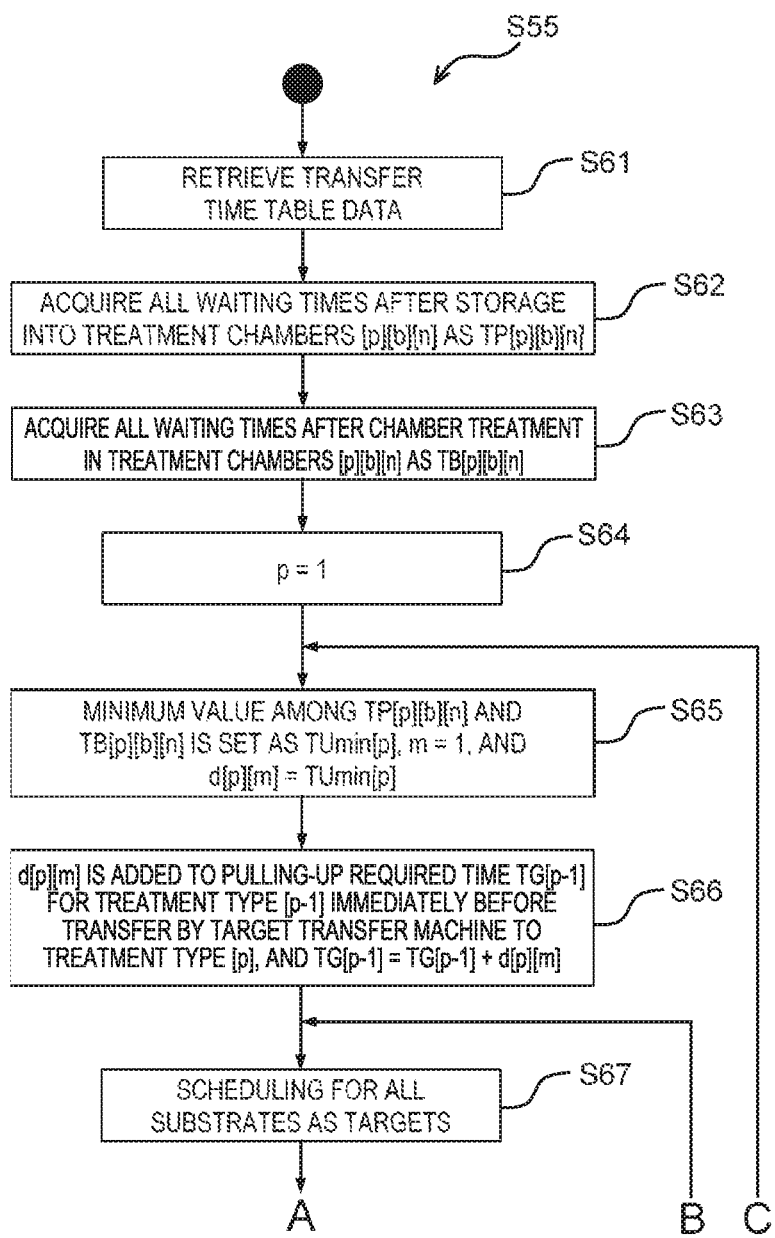
FIG. 11 is a flowchart of pulling-up correction.
Figure 12:
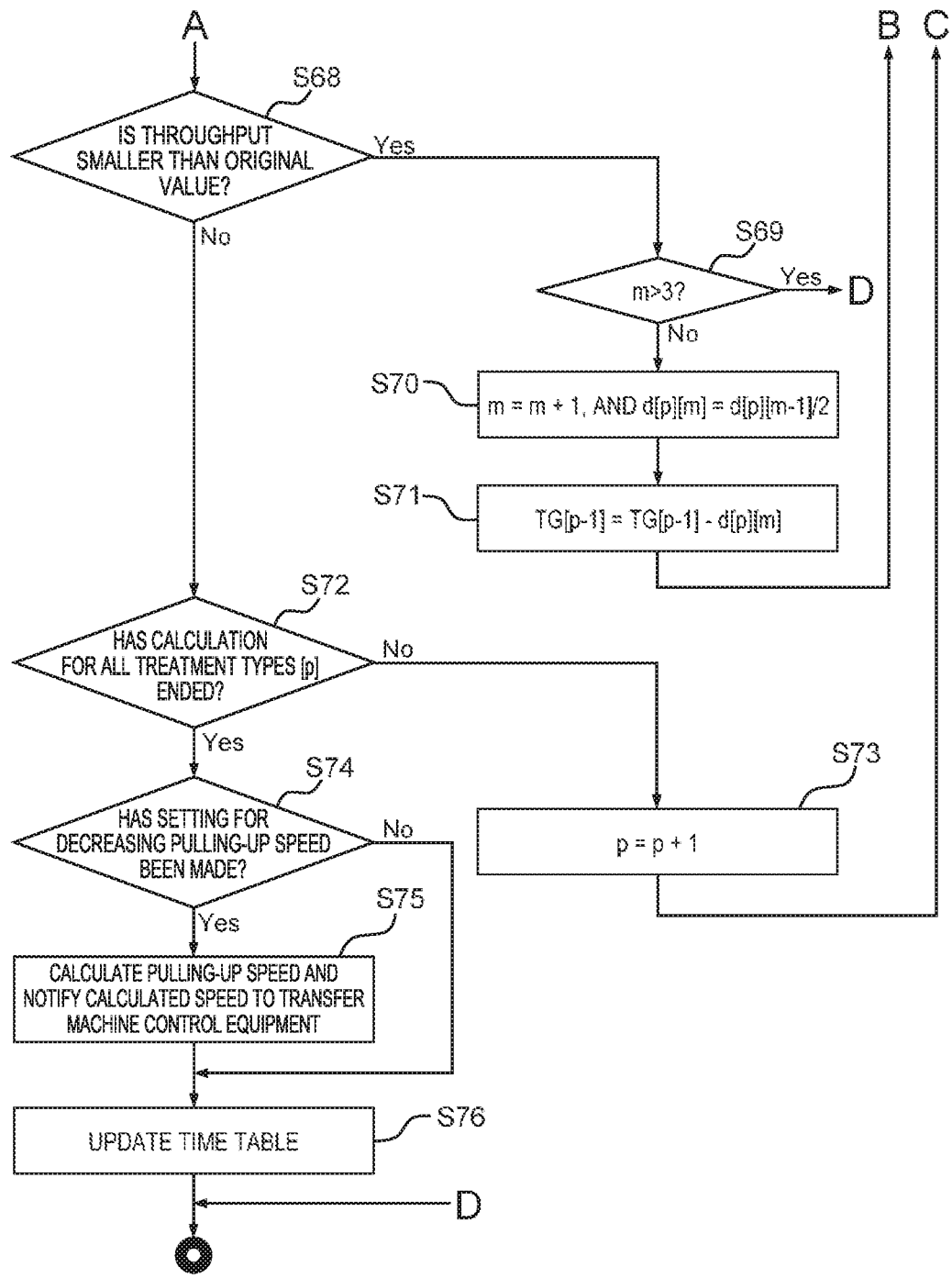
FIG. 12 is a flowchart of the pulling-up correction.

FIGS. 11 and 12 are flowcharts of the pulling-up correction process (step S55). This process is performed by a pulling-up correction process program (routine) of the transfer scheduler.

In step S61, the pulling-up correction process program (routine) retrieves data of the transfer time table created in step S53.

In step S62, waiting times of the transfer machine after storage, which are after storage of the substrate into the treatment chambers [p][b][n], are all acquired as TP[p][b][n]. [p] denotes a treatment type number. The treatment types include, for example, prerinsing treatment (prewetting chamber), pretreatment (presoaking chamber), rinsing treatment (presoaking rinsing chamber), rinsing treatment (rinsing chamber), rough drying treatment (blowing chamber), and one or a plurality of sorts of plating treatment (plating chamber). [b] denotes a treatment chamber number for distinguishing the plurality of treatment chambers in the same treatment type from each other. [n] denotes a serial number for distinguishing each substrate on the time table for the target transfer operation. "All acquired" means that in all combinations of [p][b][n], the waiting times after storage into the treatment chambers [p][b][n] are acquired as TP[p][b][n]. TP[p][b][n] correspond to the waiting period T24 in FIG. 7, for example.

In step S63, waiting times after the recipe treatment in the treatment chambers [p][b][n] are all acquired as TB[p][b][n]. "All acquired" means that in all combinations of [p][b][n], the waiting times after the recipe treatment in the treatment chambers [p][b][n] are acquired as TB[p][b][n]. TB[p][b][n] correspond to the waiting period T44 in FIG. 7, for example.

In step S64, p=1 is assumed, and the treatment type of the treatment type number p=1 is selected.

In step S65, the minimum value among TP[p][b][n] and TB[p][b][n] for every treatment chamber number [b] and serial number [n] with respect to the current treatment type number [p] is calculated as TUmin and an adjustment value d[p][m] of the pulling-up required time is set as TUmin[p] (cf. Formula (1)). That is, for each treatment type, the minimum value among TP[p][b][n] and TB[p][b][n] is set as d[p][m]. Further, a calculation frequency (number of calculation) m of the pulling-up required time is set to m=1.

$$d[p][m] = TU\min[p] \qquad (1)$$
$$= \min(TP[p][b][n], TB[p][b][n])$$

In order to leave a part of the waiting time as a margin $\Delta t$, "d[p][m]=TUmin[p]−$\Delta t$" may hold in Formula (1).

This corresponds to what has been described in FIG. 7: the shorter time between the waiting period T24 after the storage period T23 in the transfer machine and the waiting period T44 after the recipe treatment period T43 in the treatment chamber B is added to the pulling-up period T10 (T21) for pulling up the substrate from the immediately previous treatment chamber A so as to extend the pulling-up period to a pulling-up period T10A (T21A) (FIG. 8).

In step S66, d[p][m] is added to a substrate pulling-up required time TG[p−1] in a treatment chamber of a treatment type [p−1] immediately before (in transfer order of the target substrate) transfer by the target transfer machine to the treatment type [p] (Formula (2)).

$$TG[p-1]=TG[p-1]+d[p][m] \qquad (2)$$

For example, in FIG. 7, the treatment type [p] corresponds to the treatment in the treatment chamber B, the immediately previous treatment type [p−1] corresponds to the treatment in the treatment chamber A, and the pulling-up required time TG[p−1] before addition corresponds to the pulling-up period T10 (T21).

In step S67, by using the pulling-up required time TG[p−1] after correction, the transfer schedule is recalculated taking all the substrates as targets.

In step S68, it is determined whether or not the throughput has decreased in the substrate treatment in accordance with the transfer schedule after the pulling-up correction process than in the substrate treatment in accordance with the original standard transfer schedule. When it is determined that the throughput has decreased, the process shifts to step S69.

In step S69, it is determined whether or not m is larger than 3. When it is determined that m is not larger than 3, the process shifts to step S70.

In step S70, 1 is added to m for count-up, and an adjustment value d[p][m] of the pulling-up required time is corrected by Formula (3). That is, one half of the adjustment value of the current pulling-up required time is taken as a new adjustment value of the pulling-up required time.

$$d[p][m]=d[p][m-1]/2 \quad (3)$$

In step S71, the substrate pulling-up required time TG[p−1] in the treatment chamber of the immediately previous treatment type [p−1] is corrected by Formula (4). That is, a value being a half of the theoretical extendable time d[p][m−1] first added is subtracted from the theoretical extendable time d[p][m−1] first added, to calculate the pulling-up required time TG[p−1].

$$TG[p-1]=TG[p-1]-d[p][m] \quad (4)$$

For example, when d[p][1] calculated with m=1 is corrected with m=2, d[p][2]=d[p][1]/2 holds. The pulling-up required time is: TG[p−1]=TG[p−1]−d[p][1]/2. With m=3, the pulling-up required time is: TG[p−1]=TG[p−1]−d[p][1]/4.

Thereafter, by using the pulling-up required time after correction in step S70, the transfer schedule is recalculated taking all the substrate as targets (step S67). It is determined whether or not the throughput has decreased in the substrate treatment in accordance with the transfer schedule after recalculation than in the substrate treatment in accordance with the original standard transfer schedule (step S68), and when the throughput has decreased, the process from step S69 to S70 is repeated. When it is determined that m has exceeded 3 in step S69, that is, when the throughput decreases even though the correction of the adjustment value d[p][m] of the pulling-up required time and the correction of the pulling-up required time TG[p−1] in steps S70 and S71 are repeated twice, the pulling-up correction process is ended without correcting the original standard transfer schedule.

When it is determined that the throughput has not decreased in step S68, the process shifts to step S72. In step S72, it is determined whether or not the pulling-up correction process has been performed for all the treatment types [p]. When it is determined that the pulling-up correction process has not been performed for all the treatment types, the process shifts to step S73, and the correction processing number p is counted up. The process then returns to step S65, and the calculation in the pulling-up correction process is performed for the next treatment type. In step S72, when it is determined that the pulling-up correction process has been performed for all the treatment types, the process shifts to step S74.

In step S74, it is determined whether or not a setting for decreasing the pulling-up speed has been made. When it is determined that the setting for decreasing the pulling-up speed has been made, the process shifts to step S75.

In step S75, based on the pulling-up required time TG[p−1] calculated by the pulling-up correction process, the current pulling-up speed is reduced, and a new pulling-up speed is calculated and then notified to the transfer machine control equipment. Thereafter, in step S76, the transfer time table is updated. Hence the transfer schedule based on the standard transfer schedule created in step S53 is updated to the transfer time table after the pulling-up correction process.

On the other hand, when it is not determined that the pulling-up speed has been set to be decreased in S74, the pulling-up speed is not newly calculated, and in step S76, the transfer time table is updated. In this case, the pulling-up speed is not reduced, and the waiting time which is stopped after pulling-up is changed (the change includes a newly setting of the waiting time, extension of the current waiting time, or a combination of both).

In the above, when the throughput decreases more than that in the standard transfer schedule before correction, the correction to reduce the adjustment value is made, and when the correction frequency exceeds twice, the standard transfer schedule is used. However, instead of this, the correction frequency in the case where the throughput decreases more than that in the standard transfer schedule may be once, or three times or more, and the standard transfer schedule before correction may be used without addition of the adjustment value (S66) itself. Although the pulling-up required time has been adjusted above for each treatment type, the pulling-up required time may be adjusted for each substrate in each treatment type.

According to the embodiment described above, the following action effect will be produced. By performing the control to decrease the speed at which the substrate is pulled up from the treatment chamber, or performing the control to provide the waiting time at the position of substrate after the pulling-up operation, or by combining both, it is possible to drop the treatment solution from the substrate and the substrate holder and delete the amount of the treatment solution taken out. Depending on the recipe conditions, for example, the throughput in the whole apparatus may be under control of the process time in a specific treatment chamber, and there may be a temporal margin in treatment in the other treatment chambers. For example, at the time of the transfer from the treatment chamber A to the treatment chamber B, when latent throughputs in the treatment chamber A and the treatment chamber B are higher than the actual throughput in the whole apparatus (when there is a temporal margin), even extension of the time taken for the transfer from the treatment chamber A to the treatment chamber B does not affect the throughput in the whole apparatus. It is thus possible to calculate the maximum transfer time from taking out of the substrate from the treatment chamber A to storage thereof into the treatment chamber B in a range not affecting the whole throughput based on the standard transfer time table first calculated so as to maximize the throughput in the given conditions. A change is made so as to delay the start timing of movement of the substrate from the treatment chamber A to the treatment chamber B and the start timing of the storage operation in the treatment chamber B on the transfer time table such that the shorter waiting time between the waiting time of the transfer machine after storage of the substrate into the treatment chamber A at the time of creating the original time table and the waiting time after the substrate treatment in the treatment chamber A (the minimum waiting time among waiting times with respect to a plurality of substrates) is allocated to the pulling-up operation (the pulling-up required time) from the treatment chamber A. By simultaneously calculating the pulling-up operation speed and transmitting the calculated speed to the transfer control equipment, it is possible to decrease the pulling-up speed and reduce the taken-out amount of the treatment solution in the treatment chamber A. Alternatively, by changing the transfer time table such that the shorter waiting time as referred to above is assigned with the waiting time after completion of the pulling-up operation while the pulling-up speed remains unchanged, it is possible to reduce the taken-out amount of the treatment solution in the treatment chamber A. Decreasing the pulling-up speed by transmitting the calculated speed to the transfer control equipment may be combined with setting or extending the waiting time after completion of the pulling-up operation. In this case, it is possible to adjust the whole pulling-up required time to a desired value even when there are limits on the speed adjustment range.

Further, such a function is provided that, when changing the operation (pulling-up operation) requires confirmation or approval of the operator or the upper-rank host computer, a recommended value or a recommended setting concerning the change in the pulling-up speed calculated from the given conditions is notified to the operator or the upper-rank side. In a case where a tolerance is low between substrates in terms of process performance due to processing in a product process on the same lot or some other case, by mounting a function to change the operation only when recommendation information (recommended value, recommended setting) concerning a change in the pulling-up operation is presented to the operator or the upper-rank host computer and then permitted, it is possible to appropriately deal with both holding of the process performance and reduction in amount of the treatment solution taken out.

In addition, the correction process according to the above embodiment is applicable to a scheduler of a simulation system and a scheduler using a graph network. The configuration to transfer the substrate held on the substrate holding member (substrate holder) has been described above, but it is also applicable to a configuration in which the substrate is directly held and transferred by the transfer machine.

From the above embodiment, at least the following technical ideas can be understood.

According to a first mode, there is provided a substrate treatment apparatus including: a plurality of treatment chambers that perform treatment of different treatment types on a substrate; a transfer device that transfers the substrate; and a controller that controls the transfer of the substrate by the transfer device and the substrate treatment in each of the plurality of treatment chambers. The controller is configured to enable fixation of a time required for pulling up the substrate from each of the treatment chambers for each treatment type and creation of a transfer schedule for transferring the substrate among the plurality of treatment chambers of the plurality of treatment types and treating the substrate so as to maximize a throughput, and enable correction of the transfer schedule so as to extend, based on a waiting time of the transfer device after storage of the substrate into the treatment chamber of one treatment type and a waiting time of the treatment chamber after treatment of the substrate in the treatment chamber of the one treatment type, a time required for pulling up the substrate from a treatment chamber of an immediately previous treatment type in transfer order of the substrate.

According to this mode, when the substrate is sequentially treated in the treatment chambers of a plurality of treatment types, the time required for pulling up the substrate from each treatment chamber is fixed, and the standard transfer schedule is created so as to maximize the throughput. Thereafter, when there are a waiting time of the transfer machine after storage of the substrate into a treatment chamber of a certain treatment type and a waiting time of the treatment chamber after treatment of the substrate in the treatment chamber, based on those waiting times, the time required for pulling up the substrate is extended in a treatment chamber of the immediately previous treatment type. By decreasing a speed at which the substrate is pulled up or by stopping the substrate above the treatment chamber after pulling-up, it is possible to drop the treatment solution having adhered to the substrate and/or the substrate holder into the original treatment chamber and reduce the amount of treatment solution taken out.

According to a second mode, in the substrate treatment apparatus of the first mode, the controller controls the transfer of the substrate by the transfer device and the substrate treatment in each of the plurality of treatment chambers based on the transfer schedule after correction.

According to this mode, the transfer of the substrate by the substrate transfer device and the substrate treatment in each of the plurality of treatment chambers are controlled based on the schedule after extension of the time required for pulling up the substrate, so that it is possible to reduce the amount of the treatment solution taken out from the treatment chamber.

According to a third mode, in the substrate treatment apparatus of the first mode, the controller adds, to the time required for pulling up the substrate from the treatment chamber of the immediately previous treatment type, a shorter waiting time between the waiting time of the transfer device after storage of the substrate into the treatment chamber of one treatment type and the waiting time of the treatment chamber after treatment of the substrate in the treatment chamber of the one treatment type, or a time obtained by subtracting a predetermined time from the shorter waiting time.

According to this mode, since the shorter waiting time or the time obtained by subtracting a predetermined time from the shorter waiting time is added to the pulling-up required time, it is possible to absorb the delay in the transfer by the transfer machine from the treatment chamber of the immediately previous treatment type to the treatment chamber of the above treatment type by reduction or deletion of the waiting time of the transfer machine after storage of the substrate into the treatment chamber of the treatment type. Further, it is possible to absorb the delay in the start of the substrate treatment in the treatment chamber of the above treatment type by reduction or deletion of the waiting time of the treatment chamber after the substrate treatment in the treatment chamber of the treatment type. It is thereby possible to prevent delays in the subsequent treatment of the transfer machine and the timing of pulling-up the substrate in the treatment chamber of the treatment type due to extension of the time required for pulling up the substrate from the treatment chamber of the immediately previous treatment type, and it is possible to reduce or prevent a decrease in throughput. In the case of adding the time obtained by subtracting a predetermined time from the shorter waiting time, it is possible to more reliably prevent the delays in the subsequent treatment of the transfer machine and the timing of pulling-up the substrate in the treatment chamber of the treatment type, and it is possible to more reliably reduce or prevent the decrease in throughput.

According to a fourth mode, in the substrate treatment apparatus of the third mode the controller creates the transfer schedule with respect to each of a plurality of substrates, calculates for each treatment type the minimum value out of the waiting time of the transfer device after storage of the substrate into the treatment chamber of one treatment type and the waiting time of the treatment chamber after treatment of the substrate in the treatment chamber of the one treatment type, with respect to each of the plurality of substrates, and adds the minimum time, or a time obtained by subtracting a predetermined time from the minimum value, to the time required for pulling up the substrate from the treatment chamber of the immediately previous treatment type of each treatment type.

According to this mode, the minimum value out of waiting times of a plurality of substrates of the same treatment type (the waiting time of the transfer machine, the waiting time of the treatment chamber), or the time obtained by subtracting a predetermined time from the minimum value, is added to the time required for pulling up the substrate from the treatment chamber of the immediately previous treatment type, so that it is possible to prevent the delays in the subsequent treatment of the transfer machine and the timing of pulling-up the substrate in the treatment chamber of the treatment type for any substrate treatment. In the case of adding the time obtained by subtracting a predetermined time from the minimum value, it is possible to more reliably prevent the delays in the subsequent treatment of the transfer machine and the timing of pulling-up the substrate in the treatment chamber of the treatment type, and it is possible to more reliably reduce or prevent the decrease in throughput.

Further, it is possible to optimize the time required for pulling up the substrate for each type.

According to a fifth mode, in the substrate treatment apparatus of any of the first to fourth modes, when a throughput in the substrate treatment apparatus decreases due to extension of the time required for pulling up the substrate from the treatment chamber of the immediately previous treatment type, the controller make a correction to reduce the extended amount of the pulling-up required time, or uses the transfer schedule before correction.

According to this mode, it is possible to reduce the amount of the treatment solution taken out while preventing the decrease in throughput.

According to a sixth mode, in the substrate treatment apparatus of any of the first to fifth modes, the controller performs extension of the time required for pulling up the substrate by reducing the pulling-up speed of the substrate by the transfer device and/or by setting or extending a waiting time in the treatment chamber of the immediately previous treatment type after pulling-up of the substrate from the immediately previous treatment chamber.

According to this mode, it is possible to extend the pulling-up required time by reduction in pulling-up speed and/or the setting or extension of the stoppage time after pulling-up. Further, when there are limits on reduction in pulling-up speed, combining the reduction in pulling-up speed with the setting of the stoppage time after pulling-up can correct the length of the whole pulling-up required time to a desired length.

According to a seventh mode, in the substrate treatment apparatus of any of the first to sixth modes, the controller determines whether the extension of the pulling-up required time has been permitted, and makes a correction to extend the pulling-up required time when the extension is permitted.

According to this case, in a case where a tolerance is low between substrates in terms of process performance due to processing in a product process on the same lot or some other case, by mounting a function to change the operation only when recommendation information (recommended value, recommended setting) concerning a change in the pulling-up operation is presented to the operator or the upper-rank host computer and then permitted, it is possible to appropriately deal with both holding of the process performance and reduction in amount of the treatment solution taken out.

According to an eighth mode, in the substrate treatment apparatus of any of the first to seventh modes, the substrate is transferred in a state of being held on a substrate holding member.

According to this mode, when the substrate is transferred while being held on the substrate holding member (e.g., substrate holder), it is possible to reduce the taken-out amounts of the treatment solution having adhered to the substrate and the treatment solution having adhered to the substrate holding member.

According to a ninth mode, there is provided a controller of a substrate treatment apparatus, the controller including: a transfer schedule creation part that creates a transfer schedule for transferring the substrate among a plurality of treatment chambers of different treatment types and treating the substrate; and a correction part that makes a correction to extend, based on a waiting time of the transfer device after storage of the substrate into a treatment chamber of one treatment type and a waiting time of the treatment chamber after treatment of the substrate in the treatment chamber of the one treatment type, a time required for pulling up the substrate from a treatment chamber of an immediately previous treatment type in transfer order of the substrate. According to this mode, it is possible to produce a similar action effect to that in the first mode.

According to a tenth mode, there is provided a method for controlling a substrate treatment apparatus, the method including: creating a transfer schedule for transferring the substrate among a plurality of treatment chambers of different treatment types and treating the substrate; and making a correction to extend, based on a waiting time of the transfer device after storage of the substrate into a treatment chamber of one treatment type and a waiting time of the treatment chamber after treatment of the substrate in the treatment chamber of the one treatment type, a time required for pulling up the substrate from a treatment chamber of an immediately previous treatment type in transfer order of the substrate. According to this mode, it is possible to produce a similar action effect to that in the first mode.

According to an eleventh mode, there is provided a memory medium that stores a program for causing a computer to execute a method for controlling a substrate treatment apparatus, the memory medium storing a program for causing the computer to execute: creating a transfer schedule for transferring the substrate among a plurality of treatment chambers of different treatment types and treating the substrate, and making a correction to extend, based on a waiting time of the transfer device after storage of the substrate into a treatment chamber of one treatment type and a waiting time of the treatment chamber after treatment of the substrate in the treatment chamber of the one treatment type, a time required for pulling up the substrate from a treatment chamber of an immediately previous treatment type. According to this mode, it is possible to produce a similar action effect to that in the first mode. According to this program, it is possible to reduce the amount of the treatment solution taken out by changing the existing control program of the substrate treatment apparatus.

The present invention has been described above based on the several examples, but the embodiment of the prevention described above is intended to facilitate understanding of the present invention, and not to limit the present invention. The present invention is changed and modified without deviating from its gist, and the present invention naturally includes its equivalent. Moreover, in a range where at least a part of the problem described above can be solved or in a range where at least a part of the effect is produced, freely selectable combination, or omission, of each of the constituent elements described in claims and the specification is possible.

The present application claims priority to Japanese Patent Applications No. 2018-12953 filed on Jan. 29, 2018. The entire disclosure of Japanese Patent Applications No. 2018-12953 filed on Jan. 29, 2018, including specification, claims, drawings and summary is incorporated herein by reference in its entirety.

The entire disclosure of Japanese Patent Laid-Open No. 2011-146448 (Patent Literature 1), including specification, claims, drawings and summary is incorporated herein by reference in its entirety.

REFERENCE SIGNS LIST 100 substrate treatment apparatus
101A load/unload part (load/unload unit)
101B treatment part (treatment unit)
102 cassette table
103 substrate transfer device
103a transfer robot
104 aligner
105 substrate loading/unloading part (substrate loading/unloading unit)
105a substrate loading/unloading device
106 spin rinsing dryer
107 stocker
108 prewetting chamber
109 presoaking chamber
110a presoaking rinsing chamber
111 blowing chamber
110b rinsing chamber
112 plating treatment part (plating treatment unit)
112a plating chamber
113 substrate holder transfer device
114 transfer machine
115 transfer machine
116 rail
120 apparatus computer
120A CPU
120B memory
120C operation screen application
120D substrate transfer control part
121 apparatus controller
130 operation equipment

What is claimed is:

1. A substrate treatment apparatus comprising:
a plurality of treatment chambers that perform treatment of different treatment types on a substrate;
a transfer device that transfers the substrate; and
a controller that controls the transfer of the substrate by the transfer device and the substrate treatment in each of the plurality of treatment chambers,
wherein the controller is configured to:
fix a time required for pulling up the substrate from each of the treatment chambers for each treatment type;
create a transfer schedule for transferring the substrate among the plurality of treatment chambers of the plurality of treatment types and treating the substrate so as to maximize a throughput;
correct the transfer schedule, based on a waiting time of the transfer device after storage of the substrate into a treatment chamber of one treatment type and a waiting time of the treatment chamber after treatment of the substrate in the treatment chamber of the one treatment type; and
reduce a pulling up speed of the substrate by the transfer device to thereby extend a time required for pulling up of the substrate from a treatment chamber of an immediately previous treatment type in transfer order of the substrate and extend a time for decreasing an amount of treatment solution which is adhered to the substrate in the treatment chamber of the immediately previous treatment type.

2. The substrate treatment apparatus according to claim 1, wherein the controller is configured to determine whether the extension of the pulling-up required time is permitted, and to make a correction to extend the pulling-up required time when the extension is permitted.

3. The substrate treatment apparatus according to claim 1, further including a substrate holding member configured to hold the substrate during transfer.

4. The substrate treatment apparatus according to claim 1, wherein the controller is configured to control transfer of the substrate by the transfer device and the treatment of the substrate in each of the plurality of treatment chambers based on the transfer schedule after correction.

5. The substrate treatment apparatus according to claim 4, wherein the controller is configured to determine whether the extension of the pulling-up required time is permitted, and to make a correction to extend the pulling-up required time when the extension is permitted.

6. The substrate treatment apparatus according to claim 1, wherein, in response to a determination that a throughput in the substrate treatment apparatus decreases due to extension of the time required for pulling up the substrate from the treatment chamber of the immediately previous treatment type, the controller is configured to make a correction to reduce the extended amount of the pulling-up required time, or to control the apparatus using the transfer schedule before correction.

7. The substrate treatment apparatus according to claim 6, wherein the controller is configured to determine whether the extension of the pulling-up required time is permitted, and to make a correction to extend the pulling-up required time when the extension is permitted.

8. The substrate treatment apparatus according to claim 1, wherein the controller is configured to further extend the time required for pulling up the substrate by setting or extending a waiting time in the treatment chamber of the immediately previous treatment type after pulling-up of the substrate from the immediately previous treatment chamber.

9. The substrate treatment apparatus according to claim 8, wherein the controller is configured to determine whether the extension of the pulling-up required time is permitted, and to make a correction to extend the pulling-up required time when the extension is permitted.

10. The substrate treatment apparatus according to claim 1, wherein the controller is configured to add, to the time required for pulling up the substrate from the treatment chamber of the immediately previous treatment type, a shorter waiting time between the waiting time of the transfer device after storage of the substrate into the treatment chamber of one treatment type and the waiting time of the treatment chamber after treatment of the substrate in the treatment chamber of the one treatment type, or a time obtained by subtracting a predetermined time from the shorter waiting time.

11. The substrate treatment apparatus according to claim 10, wherein the controller is configured to determine whether the extension of the pulling-up required time is permitted, and to make a correction to extend the pulling-up required time when the extension is permitted.

12. The substrate treatment apparatus according to claim 10, wherein the controller is configured to:
  create the transfer schedule with respect to each of a plurality of substrates;
  calculate for each treatment type a minimum time value out of the waiting time of the transfer device after storage of the substrate into the treatment chamber of one treatment type and the waiting time of the treatment chamber after treatment of the substrate in the treatment chamber of the one treatment type, with respect to each of the plurality of substrates; and
  add the minimum time value, or a time obtained by subtracting a predetermined time from the minimum time value, to the time required for pulling up the substrate from the treatment chamber of the immediately previous treatment type of each treatment type.

13. The substrate treatment apparatus according to claim 12, wherein the controller is configured to determine whether the extension of the pulling-up required time is permitted, and to make a correction to extend the pulling-up required time when the extension is permitted.

14. A controller of a substrate treatment apparatus, wherein the controller is configured to:
  create a transfer schedule for transferring the substrate among a plurality of treatment chambers of different treatment types to treat the substrate; and
  correct the transfer schedule, based on a waiting time of a transfer device after storage of the substrate into a treatment chamber of one treatment type and a waiting time of the treatment chamber after treatment of the substrate in the treatment chamber of the one treatment type;
  reduce a pulling up speed of the substrate to thereby extend a time required for pulling up of the substrate from a treatment chamber of an immediately previous treatment type in transfer order of the substrate and extend a time for decreasing an amount of treatment solution adhered to the substrate in the treatment chamber of the immediately previous treatment type.

15. A method for controlling a substrate treatment apparatus, the method comprising:
  creating a transfer schedule for transferring the substrate among a plurality of treatment chambers of different treatment types and treating the substrate; and
  correcting the transfer schedule, based on a waiting time of a transfer device after storage of the substrate into a treatment chamber of one treatment type and a waiting time of the treatment chamber after treatment of the substrate in the treatment chamber of the one treatment type;
  reducing a pulling-up speed and thereby extending a time required for pulling up of the substrate from a treatment chamber of an immediately previous treatment type in transfer order of the substrate and extending a time for decreasing an amount of treatment solution adhered to the substrate in the treatment chamber of the immediately previous treatment type.

16. A memory medium that stores a program for causing a computer to execute a method for controlling a substrate treatment apparatus, the memory medium storing a program configured to control the apparatus with the computer to:
  create a transfer schedule for transferring the substrate among a plurality of treatment chambers of different treatment types and treating the substrate;
  correct the transfer schedule, based on a waiting time of a transfer device after storage of the substrate into a treatment chamber of one treatment type and a waiting time of the treatment chamber after treatment of the substrate in the treatment chamber of the one treatment type; and
  reduce a pulling up speed to thereby extend a time required for pulling up of the substrate from a treatment chamber of an immediately previous treatment type in transfer order of the substrate and extend a time for decreasing an amount of treatment solution adhered to the substrate in the treatment chamber of the immediately previous treatment type.

* * * * *